United States Patent [19]

Ohsawa

[11] Patent Number: 5,464,313
[45] Date of Patent: Nov. 7, 1995

[54] HEAT TREATING APPARATUS

[75] Inventor: Tetsu Ohsawa, Sagamihara, Japan

[73] Assignees: Tokyo Electron Kabushiki Kaisha; Tokyo Electron Tohoku Kabushiki Kaisha, both of Japan

[21] Appl. No.: 191,487

[22] Filed: Feb. 4, 1994

[30] Foreign Application Priority Data

Feb. 8, 1993 [JP] Japan ................... 5-043199

[51] Int. Cl.$^6$ .................... F27D 3/12; H01L 21/00; B65G 69/00
[52] U.S. Cl. .................... 414/172; 414/937; 414/940
[58] Field of Search ............... 414/217, 940, 414/937, 160, 172, 198, 277, 280

[56] References Cited

U.S. PATENT DOCUMENTS

| | | | |
|---|---|---|---|
| 5,033,927 | 7/1991 | Pelissier | 414/217 |
| 5,048,161 | 9/1991 | Harima | 414/940 X |
| 5,064,337 | 11/1991 | Asakawa et al. | 414/940 X |
| 5,163,832 | 11/1992 | Ishii et al. | 414/940 X |
| 5,178,639 | 1/1993 | Nishi | 414/940 X |
| 5,180,273 | 1/1993 | Sakaya et al. | 414/940 X |
| 5,181,819 | 1/1993 | Sakata et al. | 414/217 |
| 5,203,445 | 4/1993 | Shiraiwa | 414/940 X |
| 5,221,201 | 6/1993 | Yamaga et al. | 414/940 X |
| 5,273,423 | 12/1993 | Shiraiwa | 414/217 X |
| 5,284,412 | 2/1994 | Shiraiwa et al. | 414/940 X |

FOREIGN PATENT DOCUMENTS

| | | | |
|---|---|---|---|
| 2178945 | 7/1990 | Japan | 414/940 |
| 2197119 | 8/1990 | Japan | 414/940 |
| 3019327 | 1/1991 | Japan | 414/940 |
| 3244121 | 10/1991 | Japan | 414/940 |
| 3248418 | 11/1991 | Japan | 414/940 |
| 3261161 | 11/1991 | Japan | 414/940 |

*Primary Examiner*—Margaret A. Focarino
*Assistant Examiner*—Stephen Gordon
*Attorney, Agent, or Firm*—Beveridge, DeGrandi, Weilacher & Young

[57] ABSTRACT

A heat treatment apparatus for semiconductor wafers is provided with a number, such as two, of heat treatment units which are arranged horizontally and which load wafer boats containing wafers from below. A wafer delivery section is provided to correspond to each of the two heat treatment units, and wafers are conveyed by a wafer transfer mechanism between the wafer delivery section and the heat treatment units. Carrier accommodation racks are provided in upper and lower positions across the two heat treatment units in such a manner that they can be used in common for both wafer delivery sections. The carrier transfer mechanism is provided in front of the two carrier accommodation racks in order to convey carriers containing wafers between carrier stages at front portions of the wafer heat treatment apparatus, the two carrier accommodation racks, and the two wafer delivery sections. By making the carrier accommodation racks, the carrier transfer mechanism, and the carrier stages to be used in common for the two heat treatment units, the number of carrier accommodation positions can be increased for a single heat treatment unit, the carriers can be used more efficiently, and the area taken up by the apparatus can be reduced.

8 Claims, 6 Drawing Sheets

HEAT TREATING APPARATUS

BACKGROUND OF THE INVENTION

The present invention relates to a heat treatment apparatus for applying a heat treatment to an object such as a semiconductor wafer.

Important steps in the fabrication of a semiconductor wafer are heat treatment steps. Examples of such heat treatments include oxide layer formation, dopant diffusion, annealing, and chemical vapor deposition (CVD). Recently, vertical heat treatment apparatuses have come to be used more than horizontal furnaces, because they have advantages such as not inducing ingress of the atmospheric air.

A heat treatment apparatus requires a region for a means of transferring wafers into a wafer boat and for conveying a wafer vessel (hereinafter called a "carrier") that accommodates a number of wafers, such as a maximum number of 25 wafers, to and from the outside of the apparatus, and it also requires auxiliary equipment such as a storage rack for accommodating the carrier and a carrier transfer means. These must be accommodated in as small a space as possible, and the wafers and carrier must also be moved efficiently.

Prior art vertical heat treatment apparatuses have been constructed with these requirements in mind, such as that described in U.S. Pat. No. 5,181,819 to K. Sakata et al. That is, in this apparatus, carrier stages for conveying carriers to and from the outside of the apparatus is arranged along the front side of the entire apparatus, a wafer delivery section is provided in such a manner as to face the inner side of these carrier stages with a movement path for a carrier transfer mechanism therebetween, and also a carrier accommodation rack of, for example, four rows by two columns is arranged above the wafer delivery section in such a manner as to accommodate a maximum of eight carriers.

One heat treatment unit is arranged in the rear of the wafer delivery section, and the heat treatment unit is provided with a vertical heat treatment furnace, a boat elevator that loads and unloads a wafer boat with respect to the heat treatment furnace, and a wafer transfer mechanism that conveys the wafers between the wafer boat and the wafer delivery section.

In the above described prior art vertical heat treatment apparatus, two carriers each containing 25, for example, wafers are first placed on the carrier stages, and the carriers are turned sideways by a sideway-tipping mechanism. The carrier transfer mechanism is free to move forward and backward, and to the left and right, and is also free to rotate about a vertical axis, and it operates in such a manner that it conveys the two carriers into the wafer delivery section or the carrier accommodation rack. After a carrier has been transferred to the wafer delivery section, the wafer transfer mechanism sequentially transfers the wafers from within that carrier into a wafer boat, and then the wafer boat supporting the wafers is loaded into the heat treatment furnace.

The above described carrier accommodation rack has the function of operating as a buffer means for temporarily accommodating carriers containing product wafers, but otherwise it also has the function of accommodating carriers containing test wafers, carriers containing defective wafers used as supplementary waters, and carriers containing dummy wafers.

Test wafers are wafers that are subjected to the heat treatment together with the product wafers, then are separated from the product wafers and are sent on to a step that evaluates that heat treatment. Supplementary wafers are extra wafers that are added when there are less than the required number of product wafers, in order to prevent the changes in the gas flow within the heat treatment furnace and the resultant loss of uniformity in the heat treatment that would occur otherwise. Dummy wafers are wafers that are placed in the uppermost and lowermost positions in the wafer boat, with the objective of preventing product wafers from being subjected to the unevenness in temperature that occurs at these uppermost and lowermost positions.

Since the timing at which the carriers are conveyed between the heat treatment apparatus and the outside of the apparatus usually differs from the timing at which the heat treatment starts and ends, it is necessary to ensure that there are as many of the carriers accommodating the product wafers in the carrier accommodation rack as possible, in order to facilitate the carrier conveying and the heat treatment, and prevent any deterioration of the throughput.

In order to ensure a supply of wafers other than the product wafers, a minimum of one carrier accommodating test wafers and a minimum of, for example, two carriers accommodating dummy wafers are necessary, and thus the number of carriers accommodating supplementary wafers is limited in practice. It is preferable to have available a number of supplementary wafers that is one less than the number of product wafers that can be placed in the wafer boat. However, with a prior art apparatus, since there are so few carriers accommodating supplementary wafers, they are insufficient when the heat treatment is to be performed on only a small number of wafers (and thus more supplementary wafers are to be loaded in the wafer boat than the few product wafers, in order to ensure the uniformity of the heat treatment), and the degrees of freedom of the apparatus are reduced.

On the other hand, the heat treatment apparatus is provided with components such as a gas supply unit and exhaust unit connected to the heat treatment unit, and the entire apparatus should be made as compact as possible. In addition, the carrier stages and carrier accommodation rack are positioned in the expensive cleanroom facilities, and also a large number of heat treatment apparatuses are installed in actual fabrication works, and thus there is demand to make the area occupied by this equipment as small as possible. The above described heat treatment apparatus was designed with these requirements in mind, but, if the number of rows or columns in the carrier accommodation rack should increase, the entire apparatus will expand either horizontally or vertically by an amount equivalent to the size of the carriers. Therefore, it is not possible in practice to use a measure that simply increases the numbers of rows or columns of carriers.

Further problems with the above described apparatus include the high cost of the carrier transfer mechanism itself, and also its low movement efficiency in proportion to the large movement area that it occupice and its bad layout efficiency from the cost point of view.

SUMMARY OF THE INVENTION

The present invention was devised in the light of the above problems and has as an objective the provision of a heat treatment apparatus that can reduce the occupied area when a plurality of heat treatment furnaces are used, and also use the carriers containing objects to be treated in an efficient manner.

The heat treatment apparatus in accordance with the present invention is provided with: a plurality of heat treatment units arranged to be aligned horizontally and each having a vertical heat treatment furnace, a support boat for objects to be processed, and means for loading and unloading the support boat for objects to be processed to and from the heat treatment furnace; a carrier delivery means arranged facing the heat treatment units with a carrier conveyor region therebetween and capable of conveying a carrier containing a plurality of objects to be processed to and from an outside of the apparatus; carrier accommodation means arranged in a horizontal array between the carrier conveyor region and the heat treatment units so as to extend across a plurality of heat treatment units; a plurality of object delivery means for the objects, provided facing each of the heat treatment units on the side of the carrier conveyor region of the plurality of heat treatment units; carrier transfer means provided in a movable manner within the carrier conveyor region to convey carriers between the carrier delivery means, the carrier accommodation means, and the plurality of object delivery means; and object transfer means for conveying the objects between carriers placed in the object delivery means and the support boats of the heat treatment units. This apparatus is characterized in that the carrier accommodation means and the carrier transfer means are used in common for a plurality of heat treatment units.

The heat treatment apparatus in accordance with the present invention has carrier accommodation means and carrier transfer means that are common to a plurality of heat treatment units, and dummy objects to be processed, supplementary objects to be processed, and other objects to be processed accommodated in the carriers in the carrier accommodation means can be used in common by all of the heat treatment units. Since there are often differences in the timings at which the treatment performed by the heat treatment units start and end, putting these facilities to common use enables an increase in the number of carriers containing supplementary wafers that can be allocated to any one heat treatment unit, and therefore this arrangement can also cope with cases in which only a few product wafers are treated at a time. As a result, the present invention enables more efficient use of carriers for one heat treatment apparatus, from the point of view of the processing capability of the heat treatment, even when the area occupied by the apparatus is limited, than a heat treatment apparatus that has only one heat treatment unit.

DESCRIPTION OF THE PREFERRED EMBODIMENTS

Embodiments of the present invention will now be described with reference to the accompanying drawings.

Figure 1:
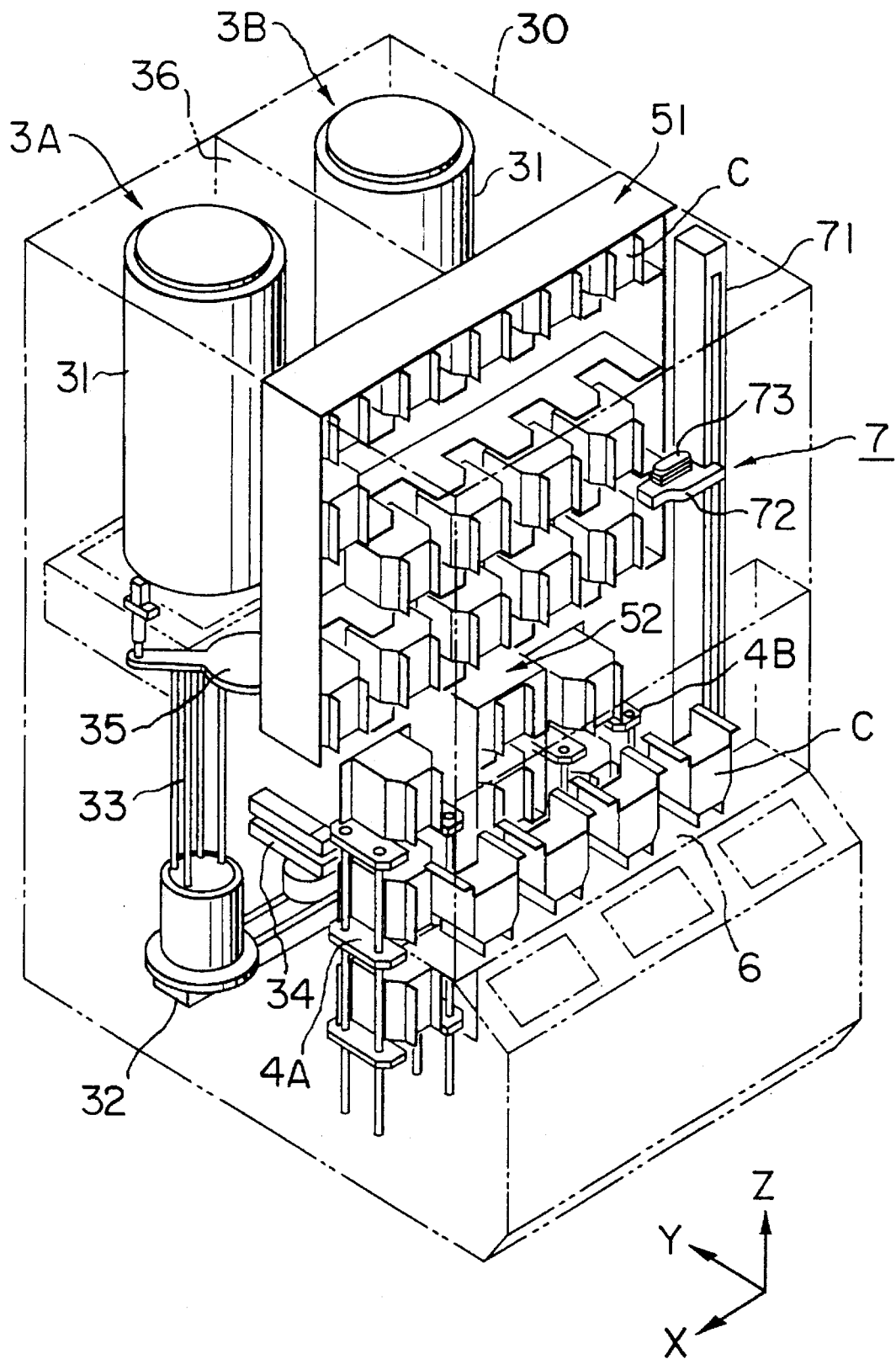
FIG. 1 is a perspective view of one embodiment of the heat treatment apparatus of the present invention, with a casing removed.
Figure 2:
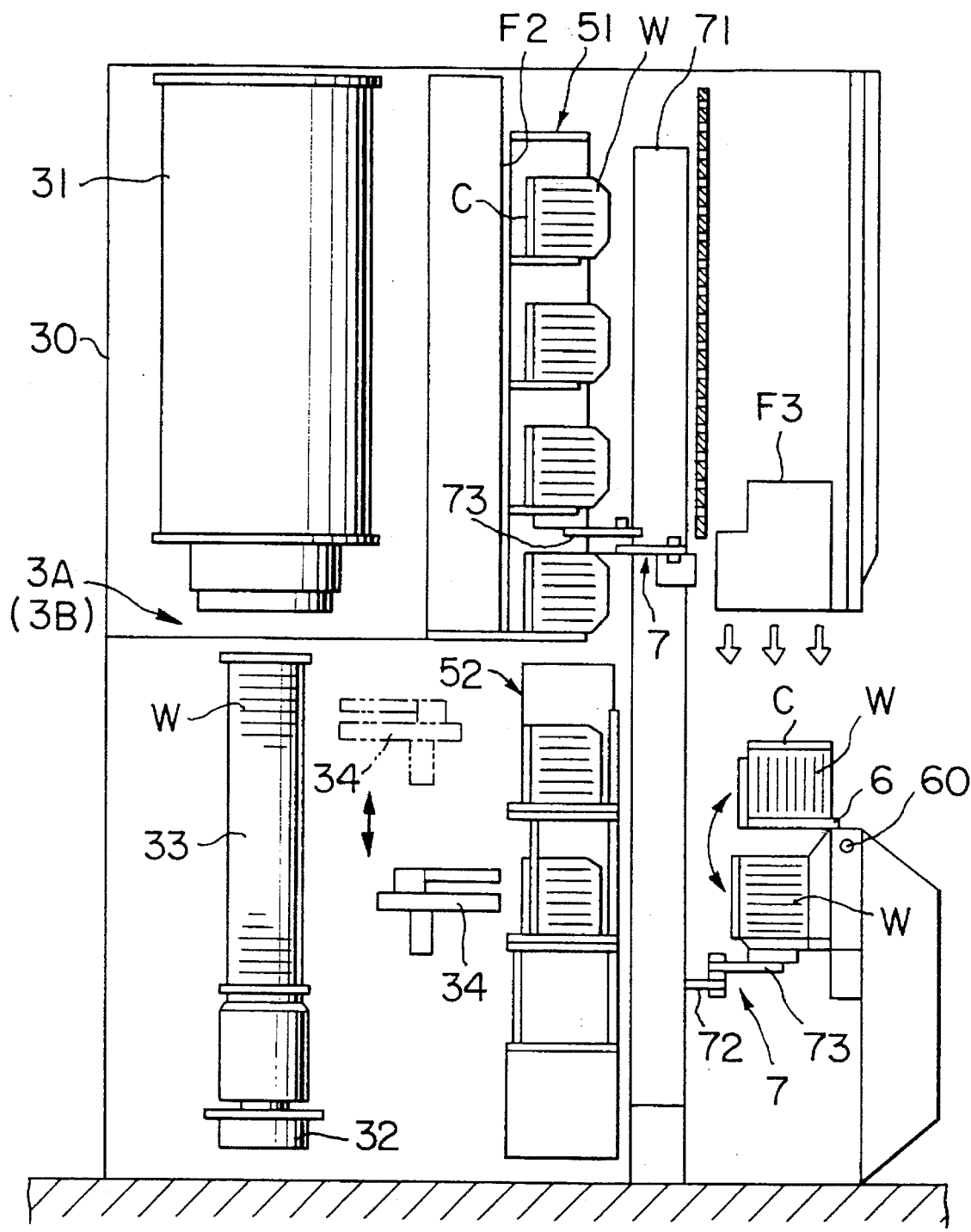
FIG. 2 is a side view showing the arrangement of internal elements in the heat treatment apparatus of FIG. 1.

A perspective view of a heat treatment apparatus is shown in FIG. 1. In this figure, the horizontal widthwise direction of the heat treatment apparatus is termed the X axis, the depthwise direction is termed the Y axis, and the vertical direction is termed the Z axis. The heat treatment apparatus is generally designated by reference numeral 30. Within the heat treatment apparatus 30 are two heat treatment units 3A and 3B arranged along the lateral direction (the X direction) of the interior thereof. As disclosed in U.S. Pat. No. 5,048,800 to S. Miyazaki et al., each of these heat treatment units 3A and 3B has a vertical heat treatment furnace 31 having a reaction tube and a heater surrounding the outer side thereof (neither being shown in the figure); a wafer boat 33 supporting a large number of objects to be processed, such as wafers W, spaced at intervals in the vertical direction as shown in FIG. 2; a boat elevator 32 for loading and unloading the wafer boat 33, together with the wafers W, into and from the heat treatment furnace 31; and a wafer transfer mechanism 34 provided with a plurality of freely advancable, freely elevatable, and freely rotatably pairs of grippers, such as those disclosed in U.S. Pat. No. 5,030,056 to H. Kitayama et al. The wafers W are conveyed while being accommodated in a carrier C of a known type, as disclosed in U.S. Pat. No. 5,181,819 to K. Sakata et al. A cover 35 of a known type is provided to close a lower edge opening of the heat treatment furnace 31 while the wafers W are being conveyed between the wafer boat 33 and the carrier C. An isolating wall 36 is provided between the heat treatment units 3A and 3B, such that the atmopsheres of the heat treatment units 3A and 3B are mutually isolated.

Wafer delivery sections 4A and 4B are provided at the front side of the heat treatment units 3A and 3B in such a manner that they face the lowest position of the wafer boats 33 with the wafer transfer mechanism 34 therebetween, respectively, and each of these wafer delivery sections 4A and 4B is configured in such a manner that it can support thereon, for example, three levels of carriers C accommodating the wafers W therein.

Figure 3:
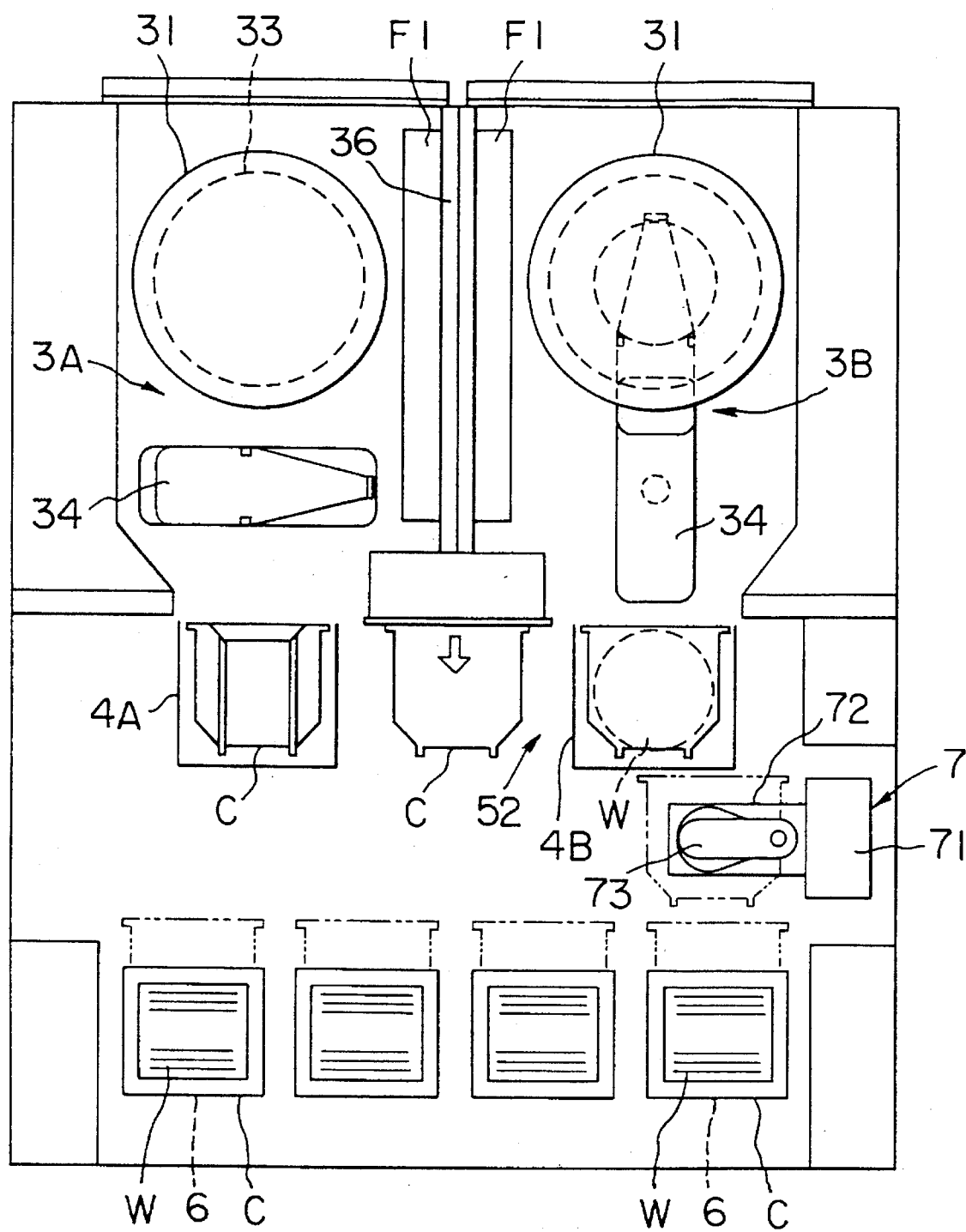
FIG. 3 is a plan view of the heat treatment apparatus of FIG. 1.
Figure 4:
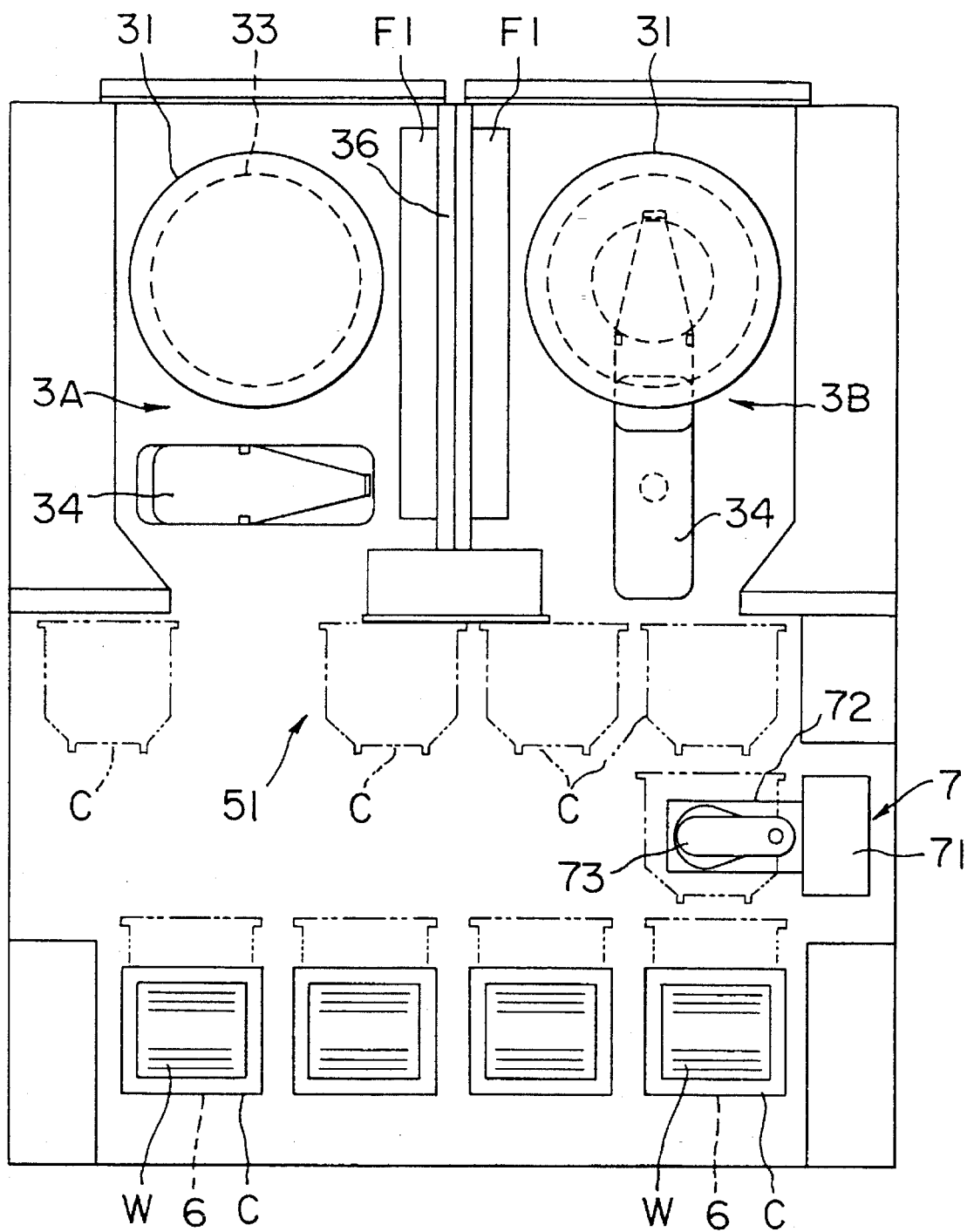
FIG. 4 is a view similar to FIG. 3, but mainly showing the arrangement of carriers.

A carrier accommodation rack 51 constituting carrier accommodation means extends over the upper regions of both of the wafer delivery sections 4A and 4B, and this carrier accommodation rack 51 is configured to be capable of accommodating a maximum of 20 carriers C in an array of four horizontal rows and five columns. Another carrier accommodation rack 52 of one horizontal row and four columns is provided between the wafer delivery sections 4A and 4B. In FIG. 3, the carriers C placed in the wafer delivery sections 4A and 4B and the carrier C accommodated in the lower carrier accommodation rack 52 are drawn with solid lines. In FIG. 4, the carriers C accommodated in the upper carrier accommodation rack 51 are drawn with broken lines (but note that some carriers C in the wafer delivery section 4A are immediately below some carriers C in the upper rack 51).

A conveyor region for a carrier transfer mechanism 7 that will be described later is reserved in a region in front of the carrier accommodation racks 51 and 52 and between the wafer delivery sections 4A and 4B, and carrier stages 6 functioning as carrier delivery means are provided in the front of the heat treatment apparatus 30, with the conveyor region disposed between the racks 51, 52 and the carrier stages 6, in plan view. The carrier stages 6 function as input-output means that convey the carriers containing the wafers to and from the outside of the apparatus, and a number of the carriers C, such as four, are mounted laterally (arranged along the X-axis direction) on these carrier stages 6 in a state wherein the wafer transfer openings of the carriers C are orientated upward, in other words, the wafers are vertical. Only one carrier stage 6 is shown schematically in FIG. 1, but in practice one is provided for each of the four carriers C, and these carriers stages 6 are combined with a carrier support mechanism that rotates the placed carriers C about a pivot shaft 60 to turn them over sideways and inwardly, as shown in FIG. 2. The arrangement is such that the carriers C are conveyed by the carrier transfer mechanism 7 in this turned-sideways state.

The carrier transfer mechanism 7, as shown in FIG. 1, includes a support column 71 that is free to move along the X-axis direction, an elevator stand 72 that rises and lowers along the support column 71, and an arm 73 that is supported by the elevator stand 72 and is freely rotatable about the Z axis in order to support and convey the carriers C.

Note that in this heat treatment apparatus, as shown in FIGS. 2 and 3, air filter portions F1 and F3 are provided in positions such as the walls of the heat treatment units 3A and 3B and the rear side of the carrier accommodation rack 51 and above the carrier stages 6, in order to exclude dirt such as extremely small particles from the apparatus.

The operation of the above described apparatus will now be described. If, for example, the heat treatment unit 3A is performing a heat treatment, carriers C containing wafers W that are accommodated in the carrier accommodation rack 51 or 52 are conveyed to the wafer delivery section 4A. Next, wafers W are extracted by the wafer transfer mechanism 34 from the carriers C mounted on the water delivery section 4A, and are moved into the wafer boat 33 either one wafer at a time or, if the wafer transfer mechanism 34 is provided with a plurality of pairs of grippers, a plurality of wafers at a time.

A maximum of, for example, 25 wafers can be accommodated in each carrier C, and a predetermined number of wafers, such as 100, can be loaded into the wafer boat 33, comprising a mixture of fabrication wafers, dummy wafers, and test wafers arranged in order to make the flow of gas within the heat treatment furnace 31 uniform. In this example, the wafer delivery section 4A accommodates three carriers C. After one of these carriers has been emptied, that carrier C is moved to the carrier accommodation rack 51 or 52 by the carrier transfer mechanism 7, and the next carrier C is conveyed to the wafer delivery section 4A from the carrier accommodation rack or 52. The conveying of the carriers C and the transfer of the wafers into the wafer boat 33 are performed in parallel.

After the predetermined number of wafers W have been loaded into the wafer boat 33, the wafer boat 33 is raised by the boat elevator 32 and is loaded into the heat treatment furnace 31 where a predetermined heat process such as oxidization or diffusion is performed. Subsequently, the wafer boat 33 is lowered by the operation of the boat elevator 32 and is unloaded from the heat treatment furnace 31, then the wafers W are moved from the wafer boat 33 to carriers C on the wafer delivery section 4A. Heat treatment is performed by the other treat treatment unit 3B in the same manner, and the wafer transfer mechanisms 34 can be made to work for both of the two heat treatment units 3A and 3B by adjusting the processing timing.

While the wafers are being subjected to a heat treatment in the heat treatment furnace 31, or while they are being conveyed by the wafer transfer mechanism 34 as above described, other operations could be performed as required. For examples, carriers C containing product wafers that have already been subjected to the heat treatment could be conveyed to the carrier stages 6 from the carrier accommodation rack 51 or 52 by the carrier transfer mechanism 7, or carriers C containing untreated wafers that have been conveyed into the carrier stages 6 from the outside could be conveyed to the carrier accommodation rack 51 or 52. The carriers C need not necessarily be conveyed via the carrier accommodation rack 51 or 52; they could be conveyed directly between the carrier stages 6 and the wafer delivery sections 4A and 4B if the carrier accommodation racks 51 and 52 should become empty, for example.

In this case, the carrier accommodation racks 51 and 52 and the carrier stages 6 are used in common by both wafer delivery sections 4A and 4B. The carrier accommodation racks 51 and 52 have ready a number of carriers C that each accommodate dummy wafers, test wafers, and supplementary wafers, and carriers C containing already-processed test wafers, dummy wafers, and supplementary wafers are used in common for both wafer delivery section 4A and 4B. Therefore, if the number of untreated wafers conveyed to the carrier stages 6 from the outside should fall below a predetermined number, supplementary wafers in the carriers provided by the carrier accommodation racks 51 and 52 can be used so that the predetermined number of wafers are loaded into the wafer boat 33 for heat treatment performed in the heat treatment unit 3A or 3B.

Figure 5:
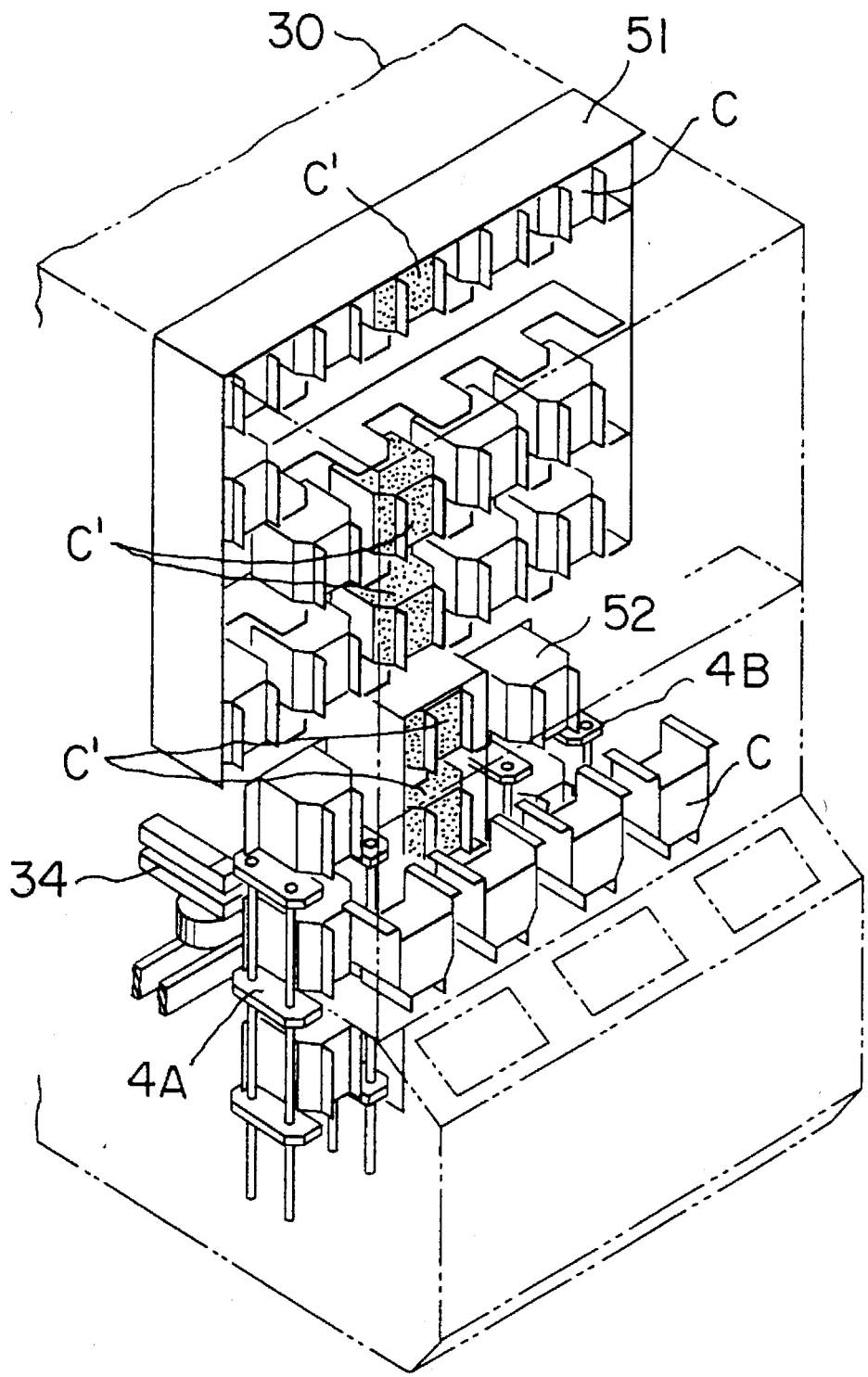
FIG. 5 is an explanatory view showing how the number of carriers stored is increased.

With the above described embodiment, two heat treatment units 3A and 3B are arranged in a horizontally aligned manner in the heat treatment apparatus 30, and a carrier accommodation rack 51 is arranged in front of the heat treatment units 3A and 3B between the left edge portion of one heat treatment unit 3A and the right edge portion of the other heat treatment unit 3B. Therefore, if the carrier accommodation rack is designed to have a minimum lateral width determined by the total width of the two heat treatment units, the number of carrier columns (number of carriers in one row) of the carrier accommodation rack 51 can be increased by the number of carriers C' shown dotted in FIG. 5, in comparison with prior art apparatus which have two separate such racks aligned laterally for the two heat treatment units, moreover a carrier accommodation rack 52 can be accommodated between the wafer delivery sections 4A and 4B, and thus the volume of carriers accommodated by the carrier accommodation racks can be increased.

The timing at which the heat treatments performed by the heat treatment units 3A and 3B starts and ends can be made different by means such as a sequencing program, and there are also differences due to different types of heat treatment. Thus, the number of carriers containing supplementary wafers can be increased for each heat treatment unit, so that, even if the number of product wafers is very small, for example, one, the insufficiency in wafers can be supplemented by the supplementary wafers and thus a single wafer can be subjected to a heat treatment if necessary, increasing the degrees of freedom of the apparatus. Since the number of carriers C containing product wafers is also increased, a large buffer function can be achieved so that wait times can be reduced even when there are differences in the treatment timings of the heat treatment apparatus or the timings at whic the carriers C are conveyed to and from the outside of the apparatus.

Since the carrier transfer mechanism 7 is used in common for both heat treatment units 3A and 3B, the cost is reduced when compared with an apparatus where a carrier transfer mechanism 7 is provided for each of the heat treatment units 3A and 3B.

Figure 6:
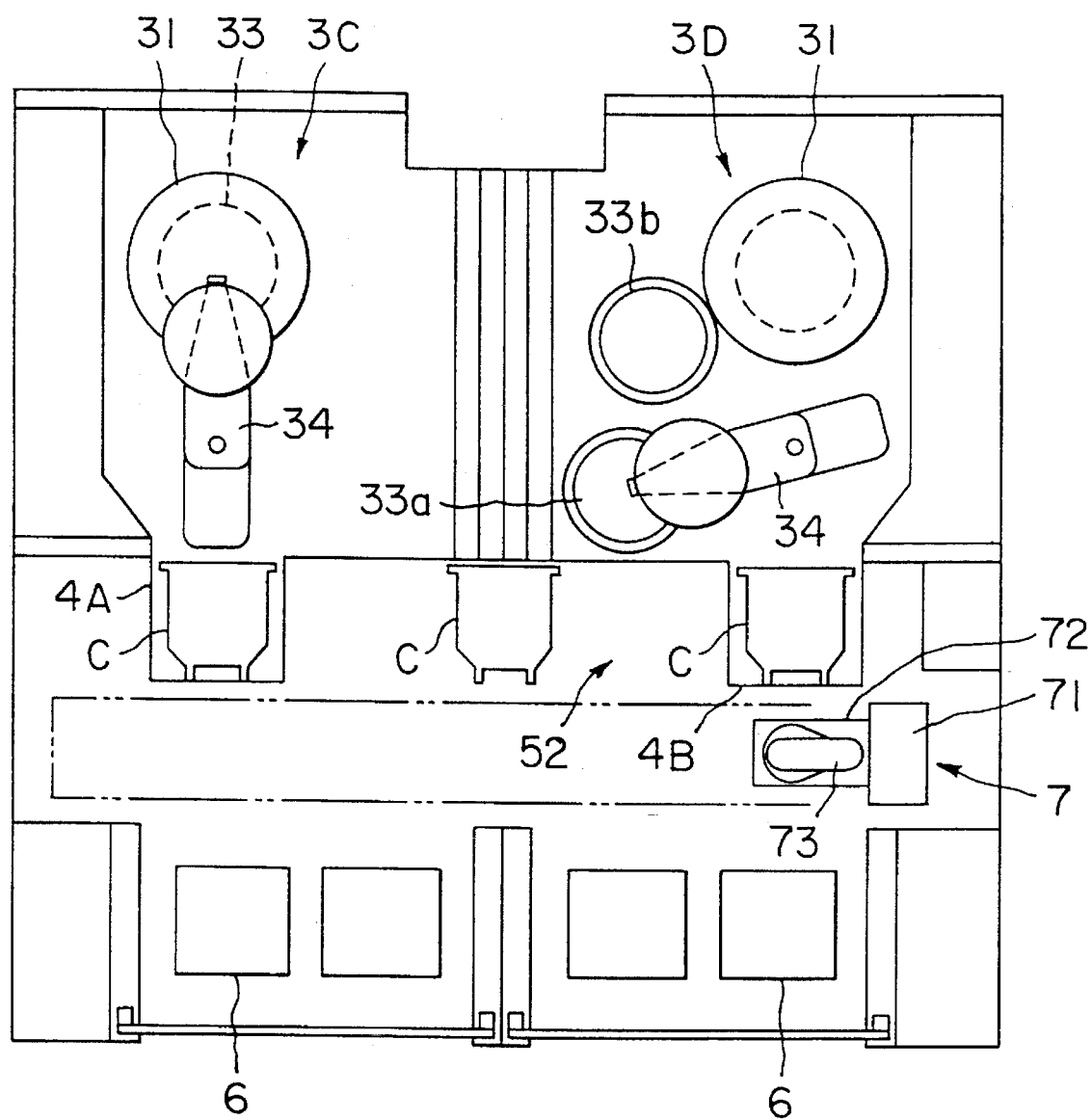
FIG. 6 is a schematic plan view of another embodiment of the present invention.

The principle of the present invention can also be applied to a combination of a heat treatment unit 3C that uses one wafer boat 33 and a heat treatment unit 3D that uses two wafer boats 33a and 33b, as shown in FIG. 6. In this embodiment, the heat treatment unit 3D has a mounting device for each of the wafer boats 33a and 33b within a region wherein wafers can be delivered by the wafer transfer mechanism 34, and the configuration is such that, while one of the wafer boats is being loaded into the heat treatment furnace 31, wafers are being transferred into the other wafer boat. With the embodiment of FIG. 6, the lower carrier accommodation rack 52 is configured of, for example, two rows. Note that in this case, the upper carrier accommodation rack can be provided with, for example, five columns.

It should be obvious to those skilled in the art that the present invention is not limited to a combination of two heat treatment units; it can equally well be applied to assemblies of three or more such units. The type of heat treatment could be and type of heat treatment such as oxidation, diffusion, annealing, or CVD, and the objects to be processed need not be semiconductor wafers; they could be, for example, LCD substrates.

As described above, since the present invention provides a plurality of heat treatment units arranged in a line and a carrier accommodation portion is used in common by all of these heat treatment units, the area occupied when a plurality of vertical heat treatment furnaces are used can be reduced, and the carriers of objects to be processed can be used efficiently. Since a carrier transfer mechanism is also used in common for the heat treatment units, the present invention is also economically advantageous from the point of view of heat treatment capability.

What is claimed is:

1. A heat treatment apparatus comprising:

a plurality of heat treatment units aligned horizontally with an intermediate region therebetween, each heat treatment unit having a vertical heat treatment furnace, a support boat for objects to be processed, and means for loading and unloading said support boat for objects to and from said heat treatment furnace;

carrier delivery means facing said heat treatment units for conveying a carrier containing a plurality of objects to be processed to and from an outside of the apparatus, the carrier delivery means being spaced from the heat treatment units so as to form a carrier conveyor region between the carrier delivery means and the heat treatment units;

carrier accommodation means arranged in a horizontal array between said carrier conveyor region and said heat treatment units, said carrier accommodation means extending continuously across said heat treatment units including a region facing said intermediate region between the heat treatment units;

a plurality of object delivery means for supporting said objects for delivery, one of said object delivery means being provided facing each of said heat treatment units;

carrier transfer means moveable within said carrier conveyor region, for conveying carriers between said carrier delivery means, said carrier accommodation means, and said plurality of object delivery means; and object transfer means for conveying the objects between carriers placed in each said object delivery means and said support boats of said heat treatment units;

wherein said carrier accommodation means and said carrier transfer means are used in common for each of the plurality of heat treatment units.

2. A heat treatment apparatus according to claim 1, wherein said carrier accommodation means is in a position higher than said carrier delivery means.

3. A heat treatment apparatus according to claim 1, wherein said carrier accommodation means includes an upper carrier accommodation means in a position higher than said carrier delivery means and a lower carrier accommodation means in a position at substantially the same height as said carrier delivery means.

4. A heat treatment apparatus according to claim 3, wherein said object transfer means is positioned adjacent said lower carrier accommodation means.

5. A heat treatment apparatus according to claim 3, wherein said upper carrier accommodation means is provided with carrier support means for supporting four horizontal rows of five carriers each, said rows being arranged at different levels.

6. A heat treatment apparatus according to claim 3, wherein said lower carrier accommodation means is provided with carrier support means for supporting one row of four carriers.

7. A heat treatment apparatus according to claim 1, wherein each said object delivery means is provided with means for supporting three levels of carriers.

8. A heat treatment apparatus according to claim 1, wherein said carrier transfer means has a vertical support column that is moveable within said carrier conveyor region across all of said heat treatment units, an elevator stand that is raisable and lowerable along said support column, and an arm positionable within a horizontal plane with respect to said elevator stand, for supporting and conveying a carrier supported on said elevator stand.

* * * * *